United States Patent [19]

Yamazaki et al.

[11] Patent Number: 5,016,218

[45] Date of Patent: May 14, 1991

[54] NONVOLATILE MEMORY WITH DATA WRITE CIRCUITRY TO REDUCE WRITE ERRORS

[75] Inventors: Akihiro Yamazaki; Katsuya Kiyohara, both of Kawasaki, Japan

[73] Assignee: Kabushiki Kaisha Toshiba, Kawasaki, Japan

[21] Appl. No.: 273,535

[22] Filed: Nov. 21, 1988

[30] Foreign Application Priority Data

Nov. 24, 1987 [JP] Japan .................................. 62-295695

[51] Int. Cl.$^5$ ............................................... G11C 7/00
[52] U.S. Cl. ................................ 365/189.09; 365/185
[58] Field of Search ..................... 365/185, 206, 189.09, 365/104, 189.01

[56] References Cited

U.S. PATENT DOCUMENTS

| | | | |
|---|---|---|---|
| 4,710,900 | 12/1987 | Higuchi | 365/185 X |
| 4,733,371 | 3/1988 | Tenada et al. | 365/185 |
| 4,761,764 | 8/1988 | Watanabe | 365/185 |
| 4,843,594 | 6/1989 | Tanaka et al. | 365/185 |
| 4,905,197 | 2/1990 | Urai | 365/185 X |

FOREIGN PATENT DOCUMENTS

| | | | |
|---|---|---|---|
| 0209912 | 1/1987 | European Pat. Off. | 365/104 |
| 58-114396 | 7/1983 | Japan . | |
| 0079598 | 5/1985 | Japan | 365/104 |
| 2127642 | 4/1984 | United Kingdom . | |

OTHER PUBLICATIONS

Atsumi, S. et al., "Fast Programmable 256K Read Only Memory with On Chip Test Circuits," IEEE Transactions on Electron Devices, vol. ED-32, No. 2, published Feb., 1985.

"A 25-ns 16K CMOS PROM Using a Four-Transistor Cell and Differential Design Techniques" by Pathak et al., IEEE Journal of Solid-State Circuits, vol. SC20, No. 5, Oct. 1985, pp. 964–970.

"A 19-ns 250-mW CMOS Erasable Programmable Logic Device" by Pathak et al., IEEE Journal of Solid-State Circuits, vol. SC-21, No. 5, Oct. 1986, pp. 775–784.

Primary Examiner—Joseph A. Popek
Assistant Examiner—Andrew L. Sniezek
Attorney, Agent, or Firm—Finnegan, Henderson, Farabow, Garrett, and Dunner

[57] ABSTRACT

In a nonvolatile memory of the present invention, a write circuit is connected between bit lines and a write-enable voltage terminal and has at least two write MOS transistors connected to each other in a serial manner. Since at least two write MOS transistors are connected in a serial manner, a punch-through effect is reduced even if noises occur in a write voltage system. Even in the case where a punch-through effect occurs due to the presence of a power source and transistors, a voltage on the bit line is reduced, thus preventing a write error from occurring relative to the memory cell transistors.

4 Claims, 2 Drawing Sheets

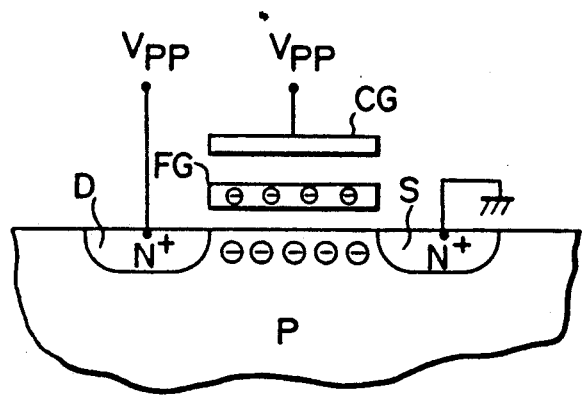
F I G. 2

NONVOLATILE MEMORY WITH DATA WRITE CIRCUITRY TO REDUCE WRITE ERRORS

BACKGROUND OF THE INVENTION

1. Field of the Invention

The present invention relates to a data write circuit connected to a nonvolatile memory cell transistor array which can prevent the possibility of data being erroneously written into a memory cell.

2. Description of the Related Art

Data write circuit 20, as shown in FIG. 1, is conventionally used for a nonvolatile memory, such as an EPROM. In such a memory, a plurality of floating gate type memory cell transistors MC have their drains connected to bit lines BL for memory cell array MA. Data write circuit 20 and data readout circuit 21 are connected to bit lines BL through bit line select transistor $T_{BL}$. Data write circuit 20 has one MOS transistor 22, such as an N-channel transistor, connected across a write voltage terminal $V_{pp}$ and bit line BL via a bit line select transistor $T_{BL}$. Write signal line WE is connected to the gate of transistor 22.

The operation of the nonvolatile memory cell transistor array is as follows.

Let it be assumed that a write operation is performed at a time of data "0". When a high voltage $V_{pp}$ is applied to write signal line WE at a write time, write transistor 22 is turned ON. With transistor 22 in an "ON" state, a voltage on the bit line BL for a specific column connected to the bit line select transistor selected by the output of the column decoder becomes level $V_{pp}$. At this time, voltage $V_{pp}$ is applied to the word line WL on a specific column selected by the output of the row decoder, and hence the voltage $V_{pp}$ is applied to the same column which is connected to the word line WL on the control gates of memory cell transistors MC. As a result, voltage $V_{pp}$ is applied across the drain D and control gate CG of a selected specific memory cell transistor MC as shown in FIG. 2, thereby causing a large current to flow across the drain and the source S (grounded) of the same transistor. Hot electrons are drawn across the channel section and into a floating gate FG by voltage $V_{pp}$ applied to the control gate CG. As a result, data "1" is written into the selected memory cell.

After the "1" data is written into the select memory cell, voltage $V_{pp}$ is no longer applied to the write signal line WE, and write transistor 22 is placed in a non-action (OFF) state.

With write transistor 22 OFF, noise is adversely produced due to some effect on that $V_{pp}$ voltage system. If the noise level exceeds level $V_{pp}$, a "punch-through" occurs in transistor 22 due to the application of a high voltage in excess of a withstand voltage to that transistor. As a result, high voltage will be erroneously applied to each bit line which is connected as a load of write transistor 22. Even if voltage $V_{pp}$ is applied to a selected column in memory array MA of a memory cell array matrix in the memory cell transistors whose gates are connected to the "not selected" column may produce hot electrons into their floating gates when a high voltage on the bit line is applied to the drains of the memory cell transistors. Such an event, when occurring infrequently (for example, once), produces no risk of data inversion. However, if such an event occurs several times repetitively, then data inversion may occur in the form of a "write error."

In the aforementioned EPROM, when the memory cell transistor is used, for example, as some type of a flag, a "write error" resulting from the noise of the $V_{pp}$ voltage prominently occurs due in part to a small transistor load, in particular of write transistor 22.

SUMMARY OF THE INVENTION

It is accordingly the object of the present invention to provide a nonvolatile memory which, even when noise occurs in a write voltage system, can prevent a high voltage from being inadvertently supplied to the drain of a memory cell transistor via a data write circuit and hence can prevent a write error from occurring relative to the memory cell transistor.

A nonvolatile semiconductor memory of the present invention comprises bit lines connected to the drains of memory cell transistors, a data write circuit connected between the bit line and a write circuit and having at least two write MOS transistors connected in a serial manner, and a write-enable signal line commonly connected to the gates of the at least two write MOS transistors.

If noise occurs in the write voltage system, a punch-through effect is less likely to occur in the respective associated transistors while the two transistors are connected in a serial manner. Even when punch-through occurs in the respective associated transistors, voltage to be applied to the bit line is lowered, thereby lowering the probability that a "write error" will occur in the memory cell transistors.

BRIEF DESCRIPTION OF THE DRAWINGS

FIG. 2 shows a model of the memory transistor as shown in FIG. 1; and

DETAILED DESCRIPTION OF THE PREFERRED EMBODIMENT

One embodiment of the present invention will be explained below with reference to the accompanying drawings.

Figure 1:
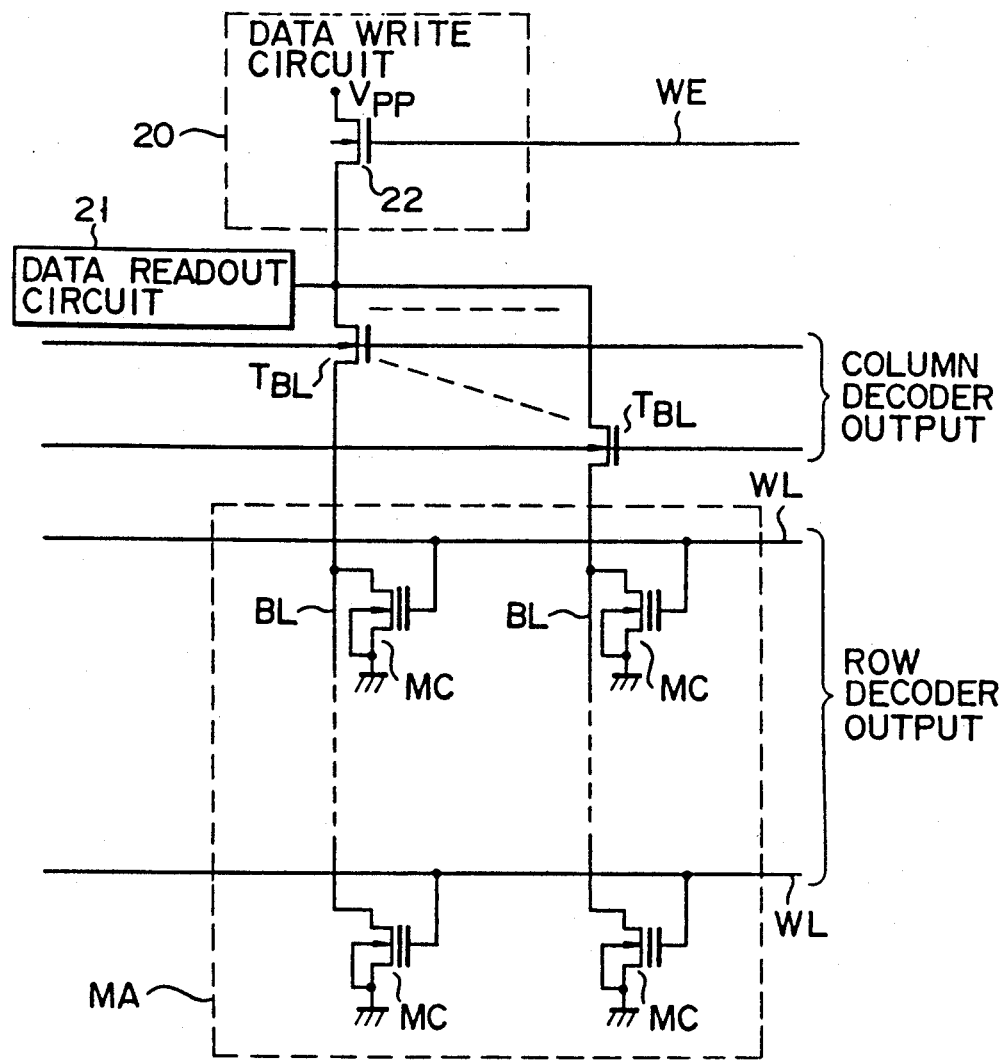
FIG. 1 shows a circuit arrangement in which a conventional data write circuit is connected to a nonvolatile semiconductor memory cell transistor array.
Figure 3:
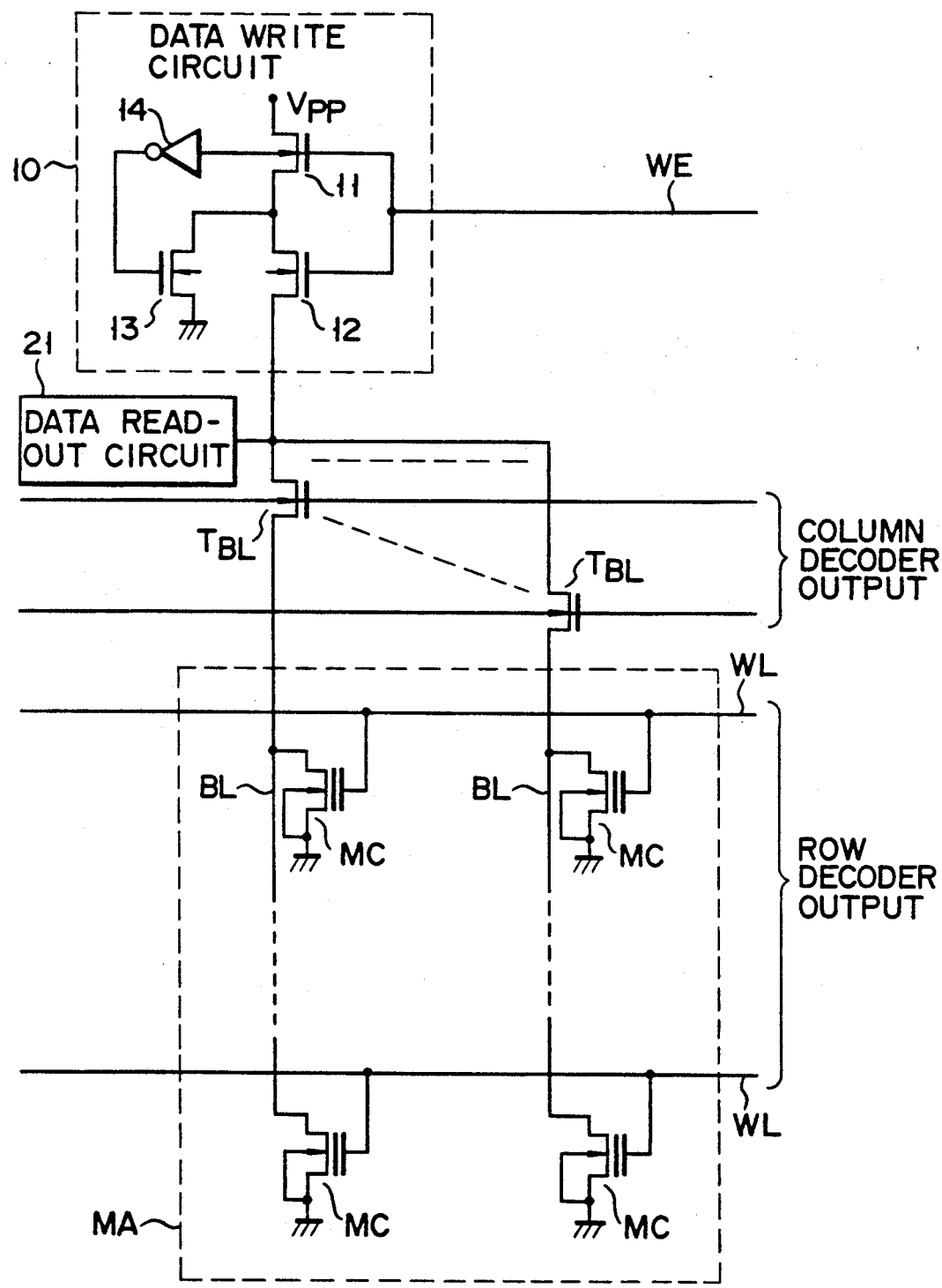
FIG. 3 shows a circuit arrangement in which a data write circuit of the present invention is connected to nonvolatile memory cell transistor array.

FIG. 3 is a circuit arrangement in which a data write circuit of the present invention is connected to a nonvolatile memory cell transistor array. MA is a memory cell transistor array having floating gate type memory cell transistors arranged in a matrix fashion. WL's are word lines for the memory cell transistor array, which are each connected to the respective gates of the memory cell transistors in the same row. $T_{BL}$'s are bit line select transistors (MOS transistors), each connected in series with the respective bit lines. Circuits 10 and 21 are a data write circuit and a data readout circuit, respectively, which are each connected to the corresponding bit line via a corresponding bit line select transistor. WE is a write-enable signal line.

In the preferred embodiment illustrated in FIG. 3, data write circuit 10 includes at least two write transistors 11 and 12, for example, N-channel MOS transistors, connected in a serial manner with the gates of the write transistors connected in common with write-enable signal line WE. MOS transistor 13, for example, an N-channel MOS transistor, which is used for short-circuit switching is connected between a junction between the write transistors 11 and 12 and a ground terminal. A signal on the write-enable line WE is supplied as an inverted signal to the gate of transistor 13 via an inverter circuit 14.

In the aforementioned circuit, with write data as "0", write voltage $V_{pp}$ is applied to write-enable signal line WE, and write transistors 11 and 12 are turned ON. At this time, transistor 13 for short-circuit switching is turned OFF by the output ("0" level) of inverter circuit 14, and hence the voltage $V_{pp}$ is supplied to the bit line side via write transistors 11 and 12. At this time, voltage $V_{pp}$ is applied to a specific bit line via select transistor $T_{BL}$ selected by the output of the column decoder and to the word line for the specific row by an output of the row decoder. As a result, a specific memory cell transistor is selected and voltage $V_{pp}$ is applied to the drain and gate of the selected memory cell transistor to allow "1" data to be written therein.

With the write data as "1", the level of the signal on the write-enable signal line WE becomes "0", and write transistors 11 and 12 are turned OFF. At this time, transistor 13 for short-circuit switching is turned ON by the output of inverter circuit 14.

Let it be assumed that, when data write circuit 10 is in a non-active state, noise voltage is generated on the $V_{pp}$ voltage system and that, at this time, write transistor 11 on the $V_{pp}$ voltage terminal side undergoes a "punch-through" upon receipt of a high voltage. Since, in this case, transistor 13 is turned ON, a charge on the junction of transistors 11 and 12 is discharged to a ground terminal. Therefore, the other transistor 12 on the bit line side experiences no punch-through, thus preventing a high voltage from being unnecessarily supplied to the bit line side. As a result, it is possible to prevent a "write error" from occurring relative to the memory cell.

Although, in the aforementioned embodiment, transistor 13 for short-circuit switching is connected between the junction of a write transistor group and a ground terminal to allow the "punch-through", if produced, to be passed through a ground terminal short-circuit path, at least two write transistors may be connected in a serial manner in place of using transistor 13. Thus, the bit line voltage at the time of a "punch-through" may be lowered, that is, the "write error" of the memory cell transistor may be prevented.

What is claimed is:

1. A nonvolatile memory comprising:
   bit lines connected to drains of corresponding memory cell transistors;
   a data write circuit, connected to each of the bit lines and to a write voltage terminal, including:
      a plurality of MOS transistors connected in series between said bit lines and said write voltage terminal, each of said plurality of MOS transistors having a gate;
      a single MOS transistor, connected to a junction between two of said plurality of serially connected MOS transistors and to a ground terminal, for supplying a current from said junction to said ground terminal;
   a write-enable signal line, connected to each of said gates of said plurality of serially connected MOS transistors, for applying write-enable signals to said gates; and
   wherein said single MOS transistor connected to said ground terminal is turned off when said plurality of serially connected MOS transistors are in an ON state, and turned on when said plurality of serially connected MOS transistors are in an OFF state, in accordance with a write-enable signal on said write-enable signal line.

2. The nonvolatile memory according to claim 1, wherein a signal on said write-enable signal line is supplied, as an inverted replica, via an inverter to a gate of said single MOS transistor connected to said ground terminal.

3. A nonvolatile memory comprising:
   bit lines connected to drains of corresponding memory cell transistors;
   a data write circuit, connected to each of the bit lines and to a write voltage terminal, including:
      a plurality of MOs transistors connected in series between said bit lines and said write voltage terminal, each of said plurality of MOS transistors having a gate; and
      a single MOS transistor, connected to a junction between two of said plurality of series-connected MOS transistors and to a ground terminal, for supplying a current from said junction to the ground terminal;
   a write-enable signal line, connected to each of said gates of said plurality of series-connected MOS transistors, for applying write-enable signals to said gates; and
   wherein said single MOS transistor is turned to an OFF state when said plurality of series-connected MOS transistors are in an ON state, and is turned to an ON state when said plurality of series-connected MOS transistors are in an OFF state, in accordance with a write-enable signal on said write-enable signal line.

4. The nonvolatile memory according to claim 3, wherein a signal on said write-enable signal line is supplied, as an inverted replica, via an inverter to a gate of said single MOS transistor connected to said ground terminal.

* * * * *

UNITED STATES PATENT AND TRADEMARK OFFICE
CERTIFICATE OF CORRECTION

PATENT NO. : 5,016,218
DATED : May 14, 1991
INVENTOR(S) : Akihiro Yamazaki et al.

It is certified that error appears in the above-identified patent and that said Letters Patent is hereby corrected as shown below:

Claim 3, column 4, line 30, change "MOs" to --MOS--.

Signed and Sealed this

Fifteenth Day of September, 1992

*Attest:*

DOUGLAS B. COMER

*Attesting Officer*    *Acting Commissioner of Patents and Trademarks*